(12) United States Patent
Luhta et al.

(10) Patent No.: US 10,007,008 B2
(45) Date of Patent: Jun. 26, 2018

(54) DETECTOR UNIT FOR DETECTOR ARRAY OF RADIATION IMAGING MODALITY

(71) Applicant: ANALOGIC CORPORATION, Peabody, MA (US)

(72) Inventors: Randy Luhta, Chardon, OH (US); Daniel Abenaim, Lynnfield, MA (US); Martin Choquette, Exeter, NH (US); Ruvin Deych, Gloucester, MA (US); Chris Vrettos, Willoughby, OH (US)

(73) Assignee: ANALOGIC CORPORATION, Peabody, MA (US)

( * ) Notice: Subject to any disclaimer, the term of this patent is extended or adjusted under 35 U.S.C. 154(b) by 0 days. days.

(21) Appl. No.: 14/907,611

(22) PCT Filed: Jul. 26, 2013

(86) PCT No.: PCT/US2013/052333
§ 371 (c)(1),
(2) Date: Jan. 26, 2016

(87) PCT Pub. No.: WO2015/012866
PCT Pub. Date: Jan. 29, 2015

(65) Prior Publication Data
US 2016/0154124 A1 Jun. 2, 2016

(51) Int. Cl.
*G01T 1/24* (2006.01)
*H01L 27/146* (2006.01)
*G01T 1/20* (2006.01)

(52) U.S. Cl.
CPC .......... *G01T 1/244* (2013.01); *G01T 1/2018* (2013.01); *H01L 27/14618* (2013.01); *H01L 27/14661* (2013.01); *H01L 2224/16225* (2013.01)

(58) Field of Classification Search
CPC .............. G01T 1/2018; G01T 1/244; H01L 2224/16225; H01L 27/14618; H01L 27/14661
See application file for complete search history.

(56) References Cited

U.S. PATENT DOCUMENTS 5,075,201 A * 12/1991 Koh ...................... H01L 23/544
250/332
6,426,991 B1 7/2002 Mattson et al.
(Continued)

FOREIGN PATENT DOCUMENTS

WO 2007117799 A2 10/2007

OTHER PUBLICATIONS

International Search Report cited in related application No. PCT/US13/052333 dated Aug. 25, 2014, pp. 15.

*Primary Examiner* — Marcus Taningco
(74) *Attorney, Agent, or Firm* — Cooper Legal Group, LLC

(57) ABSTRACT

Among other things, a detector unit for a detector array of a radiation imaging modality is provided. In some embodiments, the detector unit comprises a radiation detection sub-assembly and an electronics sub-assembly. In some embodiments, at least some portions of the detector unit, such as the electronics sub-assembly, may be formed via a semiconductor fabrication technique. By way of example, an electronics sub-assembly may be formed via a semiconductor fabrication technique and may comprise electronic circuitry which is embedded in a molding compound. In some embodiments, such electronic circuitry may be electrically coupled together via electrically conductive traces and/or vias.

20 Claims, 12 Drawing Sheets

(56) References Cited

U.S. PATENT DOCUMENTS

| | | | |
|---|---|---|---|
| 6,510,195 B1 | 1/2003 | Chappo et al. | |
| 8,829,446 B2* | 9/2014 | Abenaim | G01T 1/2018 |
| | | | 250/363.01 |
| 9,337,233 B1* | 5/2016 | Palit | H01L 27/14663 |
| 2005/0139757 A1 | 6/2005 | Iwanczyk et al. | |
| 2009/0121146 A1* | 5/2009 | Luhta | G01T 1/2018 |
| | | | 250/370.11 |
| 2012/0133001 A1 | 5/2012 | Tkaczyk | |
| 2012/0223241 A1 | 9/2012 | Kim et al. | |
| 2014/0361181 A1* | 12/2014 | Liu | G01T 1/1618 |
| | | | 250/366 |

* cited by examiner

DETECTOR UNIT FOR DETECTOR ARRAY OF RADIATION IMAGING MODALITY

BACKGROUND

The present application relates to measuring radiation attenuation by an object exposed to radiation. It finds particular application in the field of computed tomography (CT) imaging utilized in medical, security, and/or industrial applications, for example. However, it also relates to other radiation imaging modalities where converting radiation energy into digital signals may be useful, such as for imaging and/or object detection.

Today, radiation imaging modalities such as CT systems, single-photon emission computed tomography (SPECT) systems, digital projection systems, and/or line-scan systems, for example, are useful to provide information, or images, of interior aspects of an object under examination. The object is exposed to rays of radiation photons (e.g., x-ray photons, gamma ray photons, etc.) and radiation photons traversing the object are detected by a detector array positioned substantially diametrically opposite the radiation source relative to the object. A degree to which the radiation photons are attenuated by the object (e.g., absorbed, scattered, etc.) is measured to determine one or more properties of the object, or rather aspects of the object. For example, highly dense aspects (e.g., parts, items, etc.) of an object typically attenuate more radiation than less dense aspects, and thus an aspect having a higher density, such as a bone or metal, for example, may be apparent when surrounded by less dense aspects, such as muscle or clothing.

The detector array typically comprises a plurality of detector cells, respectively configured to convert detected radiation into electrical signals. Based upon the number of photons detected by respective detector cells and/or the electrical charge generated by respective detector cells between samplings, images can be reconstructed that indicate the density, z-effective, shape, and/or other properties of various aspects of the object.

The number of detector cells comprised within a detector array may be application specific. For example, in security applications where it is desirable to continuously translate an object (e.g., on a conveyor belt) while acquiring volumetric data about the object, the number of detector cells may exceed 100,000. In other applications, such as in mammography applications where the object is stationary and two-dimensional data is acquired, the number of detector cells may exceed 10,000,000.

To, among other things, facilitate a modular design of detector arrays, self-contained detector units (e.g., also referred to as tiles) have recently been developed. Respective detector units comprise a plurality of detector cells (e.g., 128 detector cells, 256 detector cells, etc.) and can be arranged with other detector units to form a detector array having a desired number of detector cells, a desired size, and/or a desired shape. For example, U.S. Pat. No. 7,582,879, assigned to Analogic Corporation, describes a self-contained detector unit that comprises, among other things, a scintillator, a photodetector array, and an integrated circuit (e.g., comprising, among other things, an A/D converter).

While the self-contained detector unit described in U.S. Pat. No. 7,582,879 has proven effective, there are areas for improvement. For example, the detector unit can add weight to the detector array, may consume valuable space within the radiation imaging modality, may be time-consuming to manufacture, and/or costly to manufacture.

SUMMARY

Aspects of the present application address the above matters, and others. According to one aspect, a detector unit for a detector array of a radiation imaging modality is provided. The detector unit is fabricated at least in part using a semiconductor fabrication technique and comprises an analog-to-digital (A/D) converter configured to convert an analog signal generated in response to detected radiation into a digital signal. The detector unit also comprises a molding compound configured to surround at least a portion of the A/D converter and an electrically conductive trace configured to electrically couple the A/D converter to at least one of a radiation detection sub-assembly or a digital processing component.

According to another aspect, a detector unit for a detector array of a radiation imaging modality is provided. The detector unit comprises a radiation detection sub-assembly configured to detect radiation and an electronics sub-assembly. The electronics sub-assembly comprises an analog-to-digital (A/D) converter configured to convert an analog signal generated by the radiation detecting component into a digital signal. The electronics sub-assembly also comprises an insulator element situated between the radiation detection sub-assembly and the A/D converter and a molding compound in which the A/D converter is embedded.

According to another aspect a radiation imaging modality is provided. The radiation imaging modality comprises an ionizing radiation source and a detector array configured to detect radiation generated by the ionizing radiation source. The detector array comprises a detector unit fabricated at least in part using a semiconductor fabrication technique. The detector unit comprises an analog-to-digital (A/D) converter configured to convert an analog signal generated in response to the radiation into a digital signal and a molding compound configured to surround at least a portion of the A/D converter. The detector unit also comprises an electrically conductive trace configured to electrically couple the A/D converter to at least one of a radiation detection sub-assembly or a digital processing component.

According to another aspect, a method for concurrently testing a plurality of detector units is provided. The method comprises electrically interconnecting a first electronics sub-assembly of a first detector unit with a second electronics sub-assembly of a second detector unit. The first electronics sub-assembly and the second electronics sub-assembly are embedded within a molding compound. The method also comprises applying an electrical charge to the first electronics sub-assembly and to the second electronics sub-assembly while the first electronics sub-assembly is electrically interconnected with the second electronics sub-assembly to concurrently test a first property of the first electronics sub-assembly and a second property of the second electronics sub-assembly. The method further comprises dicing the molding compound to physically decouple the first electronics sub-assembly from the second electronics sub-assembly.

According to yet another aspect, a method for examining an object is provided. The method comprises emitting radiation from a radiation source into an examination region comprising the object and detecting, via a detector array, at least some radiation emitted from the radiation source that traversed the object, the detector array comprising one or more detector units having an electronics sub-assembly. The electronics sub-assembly comprises electronic circuitry that has been embedded within molding compound via a semiconductor fabrication technique. The method also comprises sampling electrical charge generated by at least some of the one or more detector units of detector array.

Those of ordinary skill in the art will appreciate still other aspects of the present application upon reading and understanding the appended description.

FIGURES

The application is illustrated by way of example and not limitation in the figures of the accompanying drawings, in which like references generally indicate similar elements and in which.

DESCRIPTION

Figure 1:
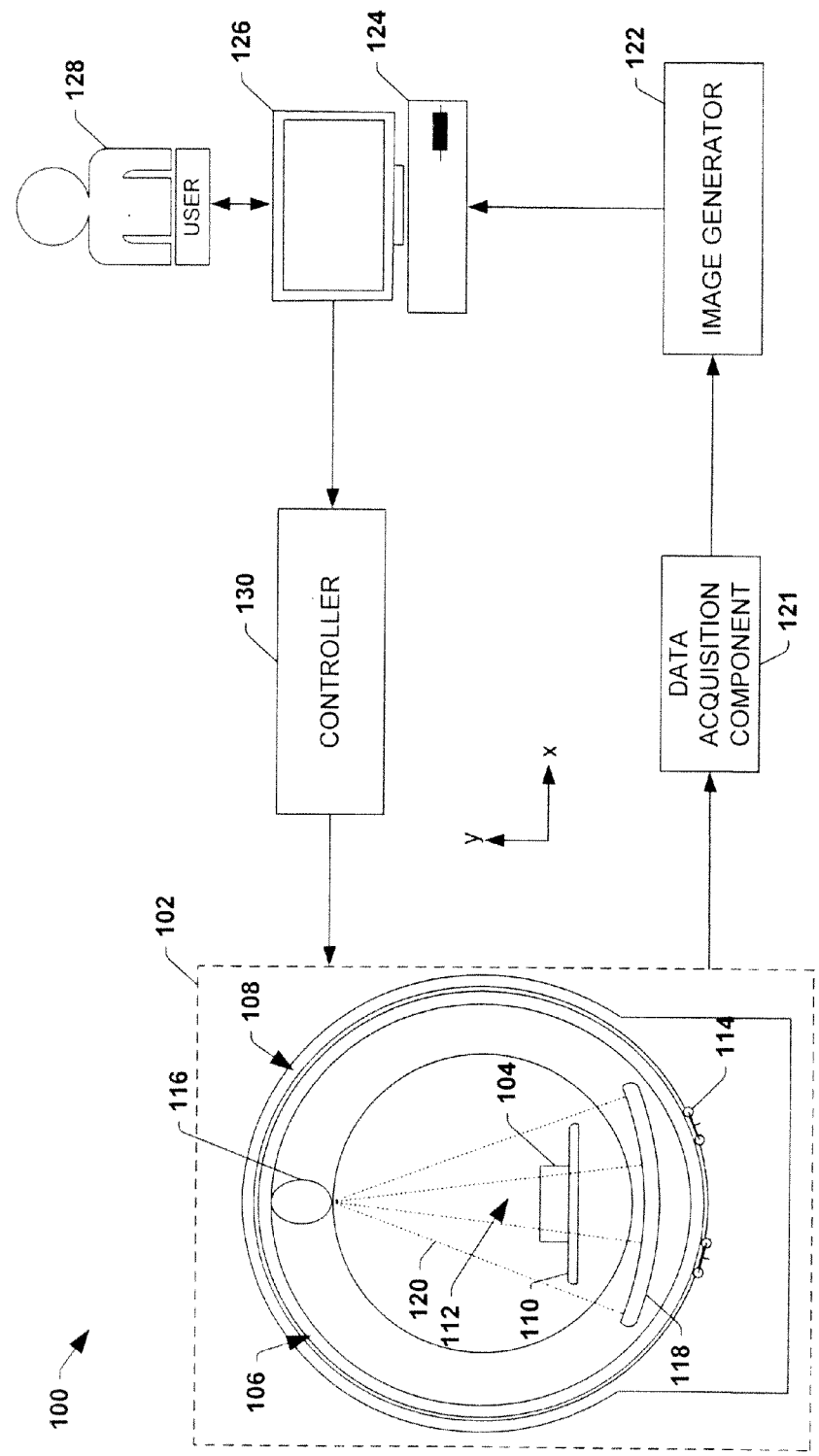
FIG. 1 illustrates an example environment of a radiation imaging modality.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

Among other things, a detector unit (e.g., also referred to as a tile, detector tile and/or the like) for a detector array of a radiation imaging modality is provided herein. The detector unit may comprise one or more detector cells respectively configured to detect radiation impinging a region occupied by the detector cell. In some embodiments, the detector cells are configured to detect radiation via an indirect conversion technique (e.g., where the radiation is converted into light energy which is then converted into electrical energy).

In some embodiments, the detector unit comprises a radiation detection sub-assembly and an electronics sub-assembly. The radiation detection sub-assembly is configured to, among other things, detect radiation and to generate an analog signal indicative of the detected radiation. By way of example, the radiation detection sub-assembly may comprise a scintillator configured to convert detected radiation into light energy and a plurality of photodetectors (e.g., where one photodetector generally corresponds to one detector cell) respectively configured to detect light energy within a particular spatial region and to generate an analog signal indicative of the detected light energy. The electronics sub-assembly is configured to, among other things, convert analog signals to digital signals. By way of example, an analog-to-digital (A/D) converter of the electronics sub-assembly may be configured to convert analog signals generated by respective photodetectors into digital signals. In some embodiments, the electronics sub-assembly comprises one or more filtering elements configured to filter at least some of the analog signals and/or digital signals, for example.

In some embodiments, at least a portion of the detector unit is fabricated via a semiconductor fabrication technique, such as a wafer level processing technique and/or a panel level processing technique. By way of example, electrical elements of the electronics sub-assembly, such as an A/D converter, resistor, capacitor, etc. may be placed on a semiconductor carrier (e.g., a wafer substrate, interconnect panel, etc.) in defined locations and may be at least partially encapsulated (e.g., surrounded and/or enclosed) by a molding compound that is cured to form a rigid or semi-rigid structure. The molded electrical elements may be removed from the semiconductor carrier (e.g., exposing electrical connections of the electrical elements at a surface of the molding compound) and additional elements, such as an insulating element and/or electrically conductive traces, may be applied to a surface of the molded electrical elements using a lithographic process to interconnect the electrical elements.

In some embodiments, a detector unit is one-side abuttable, two-side abuttable, three-side abuttable, four-side abuttable, etc. to facilitate the development of a detector array comprising a plurality of detector units (e.g., detector array having substantially any configuration). For example, a detector array may comprise 100 or more detector units which have been tiled or arrayed (e.g., arranged in rows and/columns), where the number of detector units may depend upon, among other things, the number of concurrent image slices that are desirable, the speed of object translation, speed of rotation by a rotating gantry comprising the detector array, etc. In other embodiments, a detector array may comprise a single detector unit.

FIG. 1 illustrates an example environment 100 of a computed tomography (CT) system comprising one or more detector units as provided herein. It may be appreciated that while the applicability of such detector units to a CT system is described herein, such detector units may also find applicability in other radiation imaging modalities. For example, the detector units may find applicability with line-scan systems, digital projection systems, diffraction systems, and/or other systems comprising a radiation detecting detector array. Moreover, it may be appreciated that the environment 100 merely provides an example arrangement and is not intended to be interpreted in a limiting manner, such as necessarily specifying the location, inclusion, and/or relative position of the components depicted therein. By way of example, in some embodiments, the data acquisition component 121 is part of the detector array 118 and/or is located on a rotating gantry portion of the CT system.

In the example environment 100, an examination unit 102 of the radiation system is configured to examine objects 104. The examination unit 102 comprises a rotating gantry 106 and a (stationary) support structure 108 (e.g., which may encase and/or surround at least a portion of the rotating gantry 106 (e.g., as illustrated with an outer, stationary ring, surrounding an outside edge of an inner, rotating ring)). During an examination of an object 104, the object 104 is placed on a support article 110, such as a bed or conveyor belt, for example, that may be translated into and/or through an examination region 112 (e.g., a hollow bore in the rotating gantry 106), where the object 104 is exposed to radiation 120.

The rotating gantry 106 may surround a portion of the examination region 112 and may comprise a radiation source 116 (e.g., an ionizing radiation source such as an x-ray source or gamma-ray source) and a detector array 118. The detector array 118 is typically mounted on a substantially diametrically opposite side of the rotating gantry 106 relative to the radiation source 116, and during an examination of the object 104, the rotating gantry 106 (e.g., including the radiation source 116 and detector array 118) are rotated about the object 104 by a rotor 114 (e.g., belt, drive shaft, chain, roller truck, etc.). Because the radiation source 116 and the detector array 118 are mounted to the rotating gantry 106, a relative position between the detector array 118 and the radiation source 116 is substantially maintained during the rotation of the rotating gantry 106. In embodiments where the object 104 is translated during the examination in a direction substantially parallel to an axis about which the rotating gantry 106 rotates, a helical examination is performed on the object 104.

During the examination of the object 104, the radiation source 116 emits cone-beam, fan-beam, and/or other shaped radiation configurations from a focal spot of the radiation source 116 (e.g., a region within the radiation source 116 from which radiation 120 emanates) into the examination region 112. Such radiation 120 may be emitted substantially continuously and/or may be emitted intermittently (e.g., a brief pulse of radiation 120 is emitted followed by a resting period during which the radiation source 116 is not activated). Further, the radiation 120 may be emitted at a single energy spectrum or multi-energy spectrums depending upon, among other things, whether the CT system is configured as a single-energy CT system or a multi-energy (e.g., dual-energy) CT system.

As the emitted radiation 120 traverses the object 104, the radiation 120 may be attenuated differently by different aspects of the object 104. Because different aspects attenuate different percentages of the radiation 120, the number of photons detected by respective detector cells of the detector array 118 may vary. For example, more dense aspects of the object(s) 104, such as a bone or metal plate, may attenuate more of the radiation 120 (e.g., causing fewer photons to impinge a region of the detector array 118 shadowed by the more dense aspects) than less dense aspects, such as skin or clothing.

Radiation detected by the detector array 118 may be indirectly converted into analog signals that can be transmitted from the detector array 118 to a data acquisition component 121 operably coupled to the detector array 118 (e.g., transferring the analog signals from a radiation sub-assembly of the detector array 118 to an electronics sub-assembly of the detector array 118). The analog signal(s) may carry information indicative of the radiation detected by the detector array 118 (e.g., such as an amount of charge measured over a sampling period). The data acquisition component 121 is configured to convert the analog signals output by the detector array 118, or a radiation detection sub-assembly of the detector array 118, into digital signals and/or to compile signals that were transmitted within a predetermined time interval, or measurement interval, using various techniques (e.g., integration, photon counting, etc.). The compiled signals are typically in projection space and are, at times, referred to as projections.

The projections and/or digital signals generated by the data acquisition component 121 may be transmitted to an image generator 122 configured to convert the data from projection space to image space using suitable analytical, iterative, and/or other reconstruction techniques (e.g., tomosynthesis reconstruction, back-projection, iterative reconstruction, etc.). Such images may depict a two dimensional representation of the object and/or a three dimensional representation of the object. In other embodiments, the projections and/or digital signals may be transmitted to other digital processing components, such as a threat analysis component, for processing.

The example environment 100 also includes a terminal 124, or workstation (e.g., a computer), configured to receive image(s) from the image generator 122, which can be displayed on a monitor 126 to a user 128 (e.g., security personnel, medical personnel, etc.). In this way, the user 128 can inspect the image(s) to identify areas of interest within the object(s) 104. The terminal 124 can also be configured to receive user input which can direct operations of the examination unit 102 (e.g., a speed of gantry rotation, an energy level of the radiation, etc.).

In the example environment 100, a controller 130 is operably coupled to the terminal 124. The controller 130 may be configured to control operations of the examination unit 102, for example. By way of example, in some embodiments, the controller 130 may be configured to receive information from the terminal 124 and to issue instructions to the examination unit 102 indicative of the received information (e.g., adjust a speed of a conveyor belt).

Figure 2:
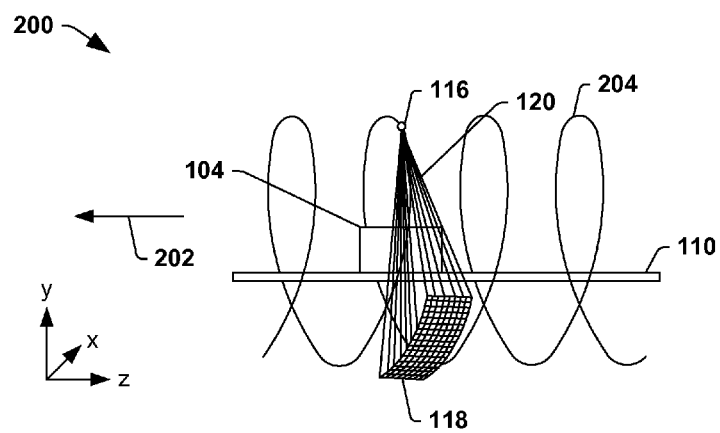
FIG. 2 illustrates a functional diagram of a helical examination performed via a CT system.

FIG. 2 is a functional diagram 200 of a helical examination performed via a CT system, such as in security applications and/or medical applications, for example. In such a system, an object 104 under examination is translated 202 in a direction parallel to an axis of rotation (e.g., along a z-axis) via a support article 110. While the object 104 is being translated, the object 104 is exposed to radiation 120 emitted from one or more radiation sources 116. A detector array 118, mounted on a substantially diametrically opposite side of the object 104 relative to the radiation source(s) 116, is configured to detect radiation 120 that has traversed the object 104. In this way, by emitting and detecting radiation 120, the object 104 is examined.

In a CT system, the radiation source(s) 116 and the detector array 118 are typically rotated about the object 104 in a plane (e.g., typically defined as an x-y plane) via a rotating gantry 106 during the examination. In this way, the radiation source(s) 116 views the object 104 from a plurality of view-angles to develop volumetric data regarding the object 104. Further, in an environment where the object 104 is translated in the z-direction, such a rotation may cause the radiation source(s) 116 and/or the detector array 118 to follow a spiral or helical-like trajectory 204 relative to the object (e.g., where the radiation source(s) 116 and detector array 118 do not move in the z-direction, and thus the helical trajectory is established by the combination of the x-y rotation of the radiation source(s) 116 and detector array 118 and the z-direction translation 202 of the object 104).

Figure 3:
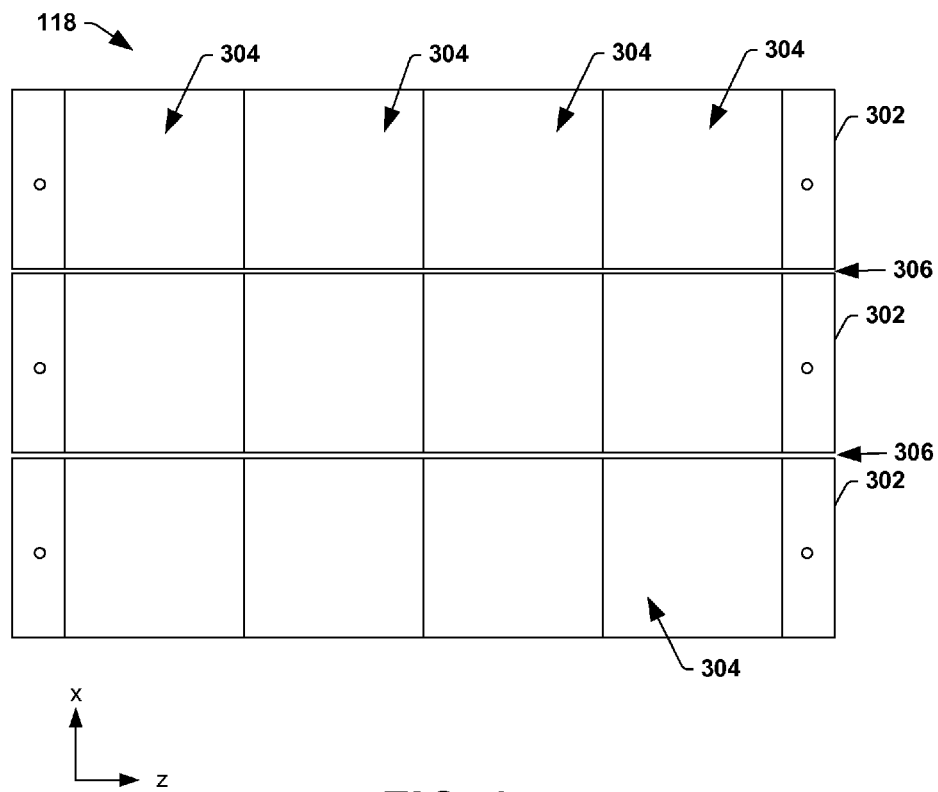
FIG. 3 illustrates a top-down view of a portion of an example detector array.

FIG. 3 illustrates a top-down view of a portion of an example detector array 118 (e.g., a view of the detector array 118 from the perspective of the radiation source(s) 116). In the illustrated embodiment, the detector array 118 comprises a plurality of detector modules 302. Respective detector modules 302 comprise one or more rows and/or columns of detector units 304, and respective detector units 304 comprise one or more detector cells. For example, in a typical configuration, a detector unit 304 may comprise 256 (e.g., 16×16) or more detector cells and a detector module 302 may comprise 4 or more detector units 304. It may be appreciated that the number of detector cells per detector unit 304, the number of detector units 304 per detector module 302, and/or the arrangement of such detector units 304 on a detector module 302 may vary based upon design considerations for a particular application (e.g., desired width of detector array 118, desired length of detector array 118, desired resolution, rotating gantry speed, object translation speed, etc.). It may also be appreciated that while the illustrated embodiment illustrates respective detector modules 302 as comprising a plurality of detector units 304, in other embodiments, one or more detector modules 302 of the detector array 118 may comprise merely one detector unit 304.

Figure 4:
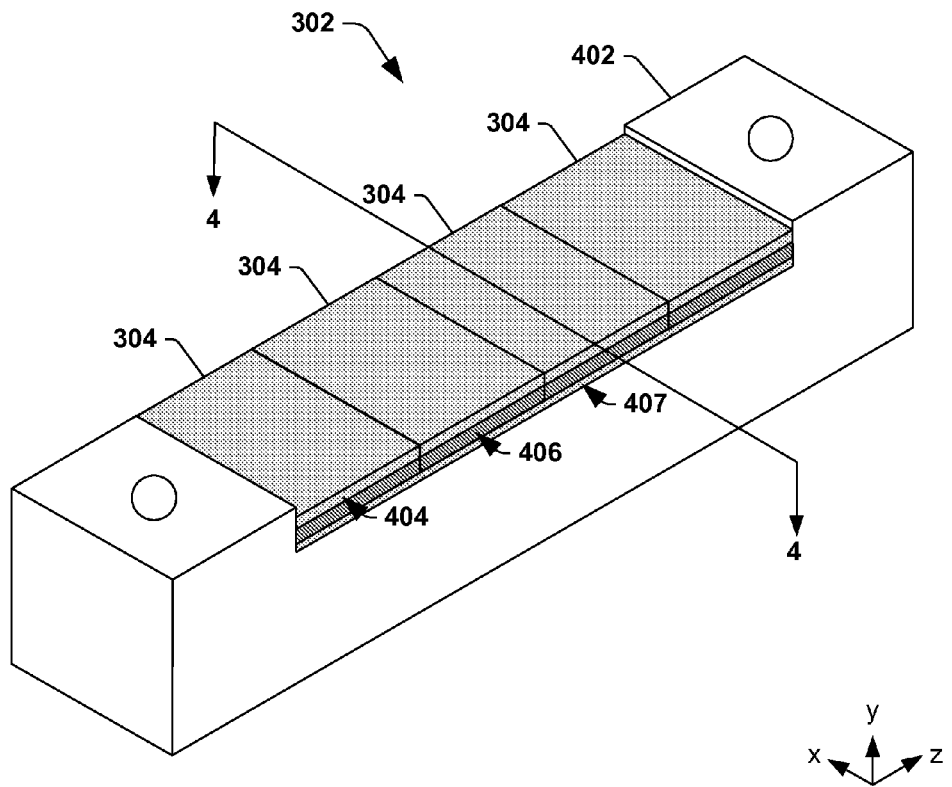
FIG. 4 illustrates a three-dimensional perspective view of an example detector module.

FIG. 4 illustrates a three-dimensional perspective view of an example detector module 302. The detector module 302 comprises a mounting bracket 402, a substrate 407, and a plurality of detector units 304. The substrate 407 comprises one or more physical channels through which communication signals and/or power signals may be transmitted and is configured to electrically couple the detector units 304 of the detector module 302 together and/or to electrically couple respective detector units 304 to one or more processing components (e.g., such as an image generator 122 and/or a threat analysis component). The substrate 407 and/or respectively detector units 304 may be physically coupled and/or thermally coupled to the mounting bracket 402 via an adhesive, fastener, etc. and the mounting bracket 402 may be physically coupled to other detector modules 302 and/or to a rotating gantry 106 to form a detector array 118, for example.

Respective detector units 304 comprise a radiation detection sub-assembly 404 (e.g., represented by the lighter shade of grey) and an electronics sub-assembly 406 (e.g., represented by the dark shade of grey). As will be further described in more detail below, the radiation detection sub-assembly 404 comprises one or more elements configured to detect radiation and/or to generate analog signals indicative of the detected radiation, and the electronics sub-assembly 406 comprises one or more elements configured to process the analog signals (e.g., convert the analog signals to digital signals, filter the analog signals and/or digital signals, etc.).

Figure 5:
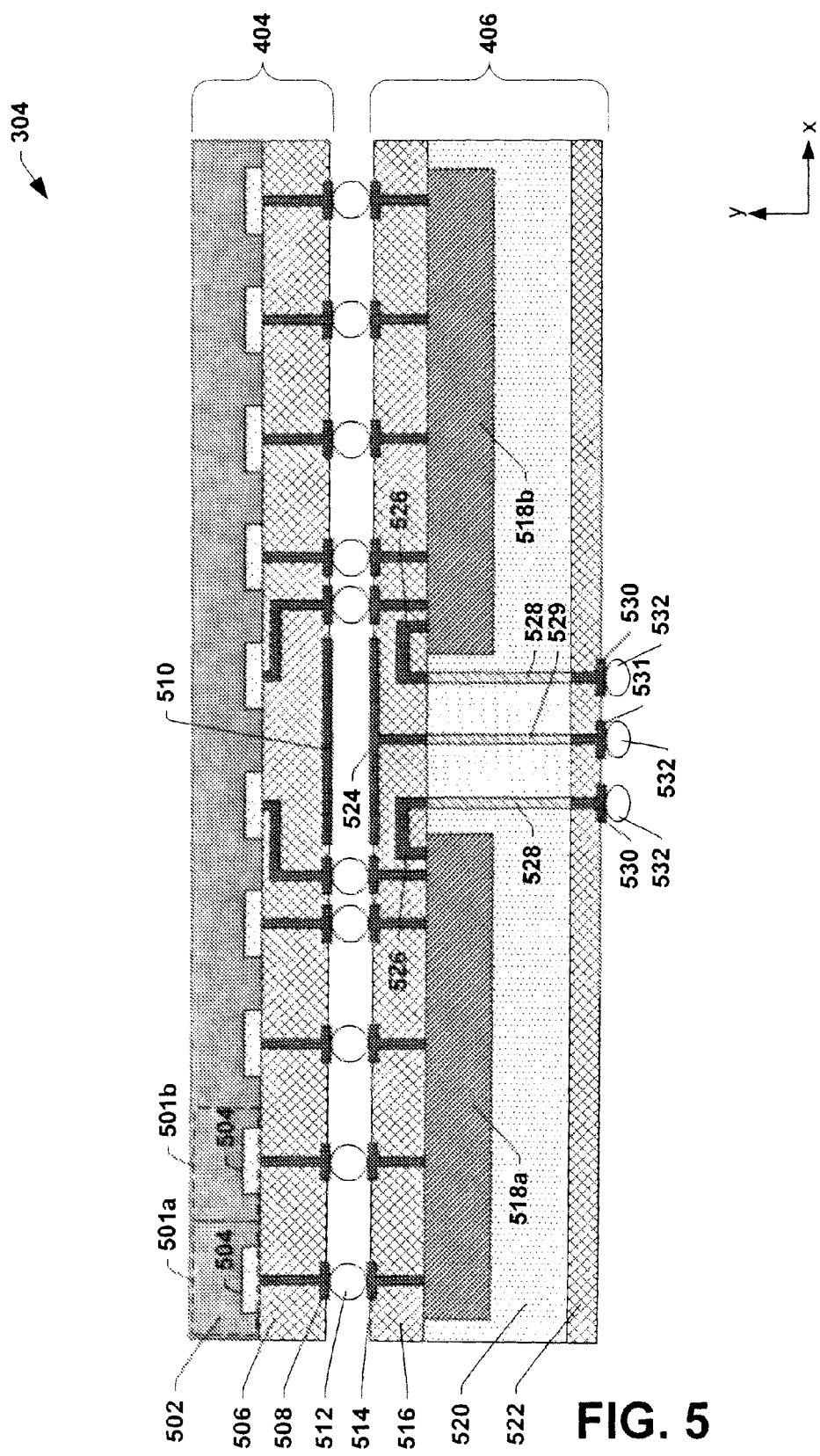
FIG. 5 illustrates a cross-sectional view of an example detector unit.

Referring to FIG. 5, a cross-sectional view of an example detector unit 304 (e.g., taken along line 4-4 in FIG. 4 but not showing substrate 407 or mounting bracket 402) comprising a radiation detection sub-assembly 404 and an electronics sub-assembly 406 is provided. The radiation detection sub-assembly 404 is physically coupled and/or electrically coupled to the electronics sub-assembly 406 via solder joints 512. Additionally or alternatively, other materials, such as a conductive epoxy, an adhesive, and/or a physical fastener (e.g., screw, bolt, rivet, etc.), etc. may be configured to physically coupled and/or electrically couple the radiation detection sub-assembly 404 to the electronics sub-assembly 406. Contact pads 532 below the electronics sub-assembly 406 may facilitate electrically coupling the detector unit 304 to other detector units and/or to electrical elements of the mounting bracket (e.g., configure to distribute power to the detector unit 304 and/or to distribute digital signals from the detector unit 304 to digital processing components, such as an image generator 122 and/or a threat detection component), for example.

In this illustrated embodiment, the radiation detection sub-assembly 404 is configured to indirectly convert detected radiation into analog signals and comprises an array of one or more photodetectors 501 (e.g., extending into and out of the page and from left-to-right on the page), and an insulator element 506 into which electrically conductive traces 508, 510 are formed. In some embodiments, respective photodetectors 501 are back-illuminated photodiodes and comprise a first aspect 502 having a first composition and a second aspect 504 having a second composition. By way of example, the first aspect 502 and the second aspect 504 may comprise a silicon composition, where the first aspect 502 is doped differently than the second aspect 504 to cause respective photodetectors 501 to be photosensitive. In other embodiments, the photodetector 501 may be a through hole via photodiode and/or other type of back-contact photodiode, for example.

In some embodiments, a scintillator (not shown) is positioned above the radiation detection sub-assembly 404 and is configured to detect radiation (e.g., x-ray radiation, gamma radiation, and/or other ionizing radiation) impinging thereon and to convert the radiation into visible light, which can be detected by one or more photodetectors 501 situated adjacent to the scintillator and/or spatially proximate to a bottom surface of the scintillator. Example materials for such a scintillator include, among other things, Cadmium Tungstate, Bismuth Germanate, Cesium Iodide, Sodium Iodide, Lutetium Orthosilicate, and/or an amorphous material.

Respective photodetectors 501 are configured to detect light in a region of the scintillator in close spatial proximity to the photodetector 501. By way of example, a first photodetector 501*a* may be configured to detect light generated within a first 1 mm square region of the scintillator, a second photodetector 501*b* may be configured to detect light generated within a second 1 mm square region of the scintillator, etc. In this way, respective photodetectors 501 are configured to measure radiation events occurring within a relatively small region of the detector array 118.

The detected light is converted by the photodetectors 501 into electrical charge, which is sampled to generate an analog signal(s). Accordingly, respective photodetectors 501 of the detector unit 304 are configured to generate an analog signal indicative of the amount of light detected by the photodetector 501 between samplings (e.g., which correlates to the amount of radiation detected, between samplings, within a region of the scintillator spatially proximate the photodetector 501).

In some embodiments, respective photodetectors 501 are constructed of a photodiode and a thin-film transistor (TFT). The photodiode is configured to generate electrical charge in response to light. The TFT, which may comprise one or more two-dimensional capacitors, is configured to store electrical charge that is generated between samplings (e.g., where the stored charge is readout of the one or more two-dimensional capacitors during the sampling). In other embodiments, the photodetectors 501 may be constructed of other devices configured to convert light into electrical charge and/or to store such electrical charge.

The insulator element 506 of the radiation detector sub-assembly 404 is situated adjacent the photodetectors 501 and/or spatially proximate a bottom surface of the photodetectors 501. In some embodiments, the insulator element 506 is configured to electrically isolate respective photodetectors 501 (e.g., to mitigate movement of electrical charge from the first photodetector 501a to the second photodetector 501b). In some embodiments, the insulator element 506 facilitates the formation of electrically conductive traces 508 and 510 (e.g., metal traces) which extend through at least a portion of the radiation detection sub-assembly 404 and which provide pathways for communication signals and/or power signals to travel through the radiation detection sub-assembly 404. By way example, a first set of electrically conductive traces 508 may extend through/along at least a portion of the insulator element 506 and may provide a pathway for transmitting analog signals from the photodetectors 501 to a bottom surface of the radiation detection sub-assembly 404 (e.g., where the analog signals can be transferred to the electronics sub-assembly 406). As another example, a second set of electrically conductive traces 510 may extend through/along at least a portion of the insulator element 506 and may provide a pathway for transmitting power signals from a power source (not shown) to the photodetectors 501. As still another example, the second set of electrically conductive traces 510 may be coupled to ground and/or may facilitate electrically shielding portions of the radiation detector sub-assembly 404 from portions of the electronics sub-assembly 406 and/or vice-versa, for example.

The insulator element 506 may have a substantially uniform composition or may have a non-uniform composition. For example, in some embodiments, the insulator element 506 may be divided into two or more layers, where a first layer comprises a first composition and a second layer comprises a second composition.

The electronics sub-assembly 406 is configured to process the analog signals generated by the radiation detection sub-assembly 404 to generate processed signals. Such processing may include, among other things, converting the analog signals to digital signals, filtering the analog signals (e.g., to reduce noise, smooth the signal, enhance aspects of the signal, etc.), and/or filtering the digital signals.

In the illustrated embodiment, the electronics sub-assembly 406 comprises a first insulator element 516, electronic circuitry 518, a molding compound 520, a second insulator element 522, and vias 528, 529.

The first insulator element 516 and the second insulator element 522 are configured to, among other things, facilitate the formation of electrically conductive traces 514, 524, 526, 530, and 531 (e.g., metal traces) which extend through at least a portion of the electronics sub-assembly 406 and are configured to provide pathways for communication signals and/or power signals through the electronics sub-assembly 406. For example, a first set of electrically conductive traces 514 may extend through/along at least a portion of the first insulator element 516 and may provide a pathway for transmitting analog signals from a top surface of the electronics sub-assembly 406 (e.g., where analog signals generated by the photodetectors 501 are received) to the electronic circuitry 518. As another example, a second set of electrically conductive traces 524 may extend through/along at least a portion of the first insulator element 516 and may provide a pathway for transmitting power signals from one or more vias 529 to the electronic circuitry 518 (e.g., via inductive and/or capacitive coupling and or through additional vias and/or traces not visible in the cross-sectional view illustrated). As another example, the second set of electrically conductive traces 524 may be coupled to ground and/or may facilitate electrically shielding portions of the radiation detector sub-assembly 404 from portions of the electronics sub-assembly 406 and/or vice-versa, for example. As another example, a third set of electrically conductive traces 526 may extend through/along at least a portion of the first insulator element 516 and may provide a pathway for transmitting processed signals (e.g., digital signals, filtered analog signals, etc.) from the electronic circuitry 518 to one or more vias 528 (e.g., for carrying the processed signals through the molding compound 520). As still another example, a fourth set of electrically conductive traces 530 may extend through/along at least a portion the second insulator element 522 and may provide a pathway for transmitting processed signals from one or more vias 528 to a bottom surface of the electronics sub-assembly 406 (e.g., where the processed signals may be transferred from the electronics sub-assembly 406 to electrically conductive mediums of a substrate 407 and/or to one or more digital processing components (e.g., such as an image generator 122)). As yet another example, a fifth set of electrically conductive traces 531 may extend through at least a portion of the second insulator element 522 and may provide a pathway for transmitting power signals from a power source (not shown) to the one or more vias 529 through which power is provided to the electronic circuitry 518.

The first insulator element 516 and/or the second insulator element 522 of the electronics sub-assembly 408 may respectively have a substantially uniform composition or may respectively have a non-uniform composition. For example, in some embodiments, the first insulator element 516 of the electronics sub-assembly may be divided into two or more layers, where a first layer comprises a first composition and a second layer comprises a second composition.

Electronic circuitry 518 is situated adjacent to the first insulator element 516 and/or spatially proximate a bottom surface of the first insulator element 516. The electronic circuitry 518 is configured process the analog signals generated by at least some of the photodetectors 501. For example, in the illustrated embodiment, a first arrangement of electronic circuitry 518a is configured to perform signal processing on analog signals generated by a first set of photodetectors 501 (e.g., including the first photodetector 501a and the second photodetector 501b) and a second arrangement of electronic circuit 518b is configured to perform signal processing on analog signals generated by a second set of photodetectors 501. In other embodiments, the electronic circuitry 518 may comprise a single arrangement configured to process analog signals generated by all of the photodetectors 501 of the detector unit 304, for example.

The electronic circuitry 518 may include one or more analog-to-digital converters (A/D converters), resistors, capacitors, application-specific integrated circuits (ASICs), field-programmable gate arrays (FGPAs), and/or other elements that are desired (e.g., required) to perform the desired signal processing. Further, such electronic circuitry 518 may include contact pads which contact one or more electrically conductive traces, such as the first arrangement of traces 514, the second arrangement of traces 524, and/or the third arrangement of traces 526 to supply power signals and/or communication signals between the electronic circuitry 118 and other components, such as the radiation detection sub-assembly 404, a digital processing component, a power source, etc. and/to ground at least some arrangement(s) of traces (e.g., to provide electrical shielding).

The molding compound 520 at least partially surrounds and/or at least partially encloses (e.g., encapsulates) the electronic circuitry 518 and is configured to maintain the electronic circuitry 518 in a desired arrangement. Such a molding compound 520 may include a silicon composition, a plastic polymer, and/or other composition that can be solidified to form a rigid or semi-rigid structure which substantially secures the relative position of elements of the electronic circuitry 518.

Vias 528, 529 may be configured to extend through at least a portion of the molding compound 520 to provide pathways for communication signals and/or power signals between the electronic circuitry and other components of the radiation imaging modality (e.g., the radiation detection sub-assembly 404, a digital processing component, a power source, etc.). By way of example, with respect to the illustrated embodiment, a first set of one or more vias 528 may provide pathways for the processed signals (e.g., digital signals) to be transmitted from the electronic circuitry 518 to a bottom surface of the electronics sub-assembly 406 (e.g., where the processed signals may be output to other components). As another example, a second set of one or more vias 529 may provide pathways for power signals to be transmitted from a power source (not shown) to the electronic circuitry 518 (e.g., via inductive and/or capacitive coupling and or through additional vias and/or traces not visible in the cross-sectional view illustrated). As another example, the second set of vias 529 may facilitate grounding one or more traces coupled thereto, such as the second arrangement of traces 524.

In some embodiments, at least some of the vias 528, 529 are copper pillars, nickel pillars, or other metal pillars which may be in direct contact with the molding compound 520 (e.g., where the molding compound 520 may act as an electrical insulator to electrically isolate signals transmitted through a first via from interfering with signals transmitted through a second via). In some embodiments, at least some of the vias 528, 529 are silicon vias or other vias in which an electrically conductive portion of the vias 528, 529 are surrounded by an insulting compound, such as silicon, for example, to form a package and the molding compound 520 is poured around the package (e.g., such that the when the molding compound 520 is cured, the package is enclosed within the molding compound 520.

An example operational flow of the foregoing detector unit 304 is as follows. Power is supplied to the photodetectors 501 via a pathway that includes a first arrangement of electrically conductive traces 510 (e.g., operably coupled to a first power source). Power is also supplied to the electronic circuitry 518 via a pathway that includes a second arrangement of electrically conductive traces 531 (e.g., operably coupled to a second power source), a first set of one or more vias 529, and a third arrangement of electrically conductive traces 524. When radiation is detected, a region of the scintillator proximate to where the radiation impinged lights up, causing a photodetector 501 to generate an electrical charge. The photodetector 501 is subsequently sampled to generate an analog signal indicative of the detected radiation, which follows a pathway from the photodetector 501 to the electronic circuitry 518 that includes an electrically conductive trace 508 of a fourth arrangement, a solder joint 512, and an electrically conductive trace 514 of a fifth arrangement. The electronic circuitry 518 processes the analog signal and outputs a processed signal (e.g., digital signal) which follows a pathway that includes an electrically conductive trace 526 of a sixth arrangement, a second set of one or more vias 528, and an electrically conductive trace 530 of a seventh arrangement.

It may be appreciated that the foregoing arrangement and operational flow of the detector unit 304 is merely intended as an example, and the scope of the application, including the scope of the claims, is not intended to be limited to such an arrangement. By way of example, a radiation shielding element may be situated within the radiation detector sub-assembly 404 and/or the electronics sub-assembly 406 to mitigate radiation exposure to the electronic circuitry 518. As another example, electrical shielding may be situated within the electronics sub-assembly 406 to mitigate cross-talk between the digital signals and the analog signals (e.g., mitigate the introduction of noise into the analog signals due to the digital signals) and/or to mitigate the introduction of noise into such signals by the electronic circuitry 518, for example. As still another example, the placement of elements of the detector unit 304, such as electrically conductive traces, vias, electronic circuitry, etc. may differ from the foregoing arrangement to, among other things, mitigate cross-talk between the digital signals and the analog signals, mitigate interference by the power signals, and/or mitigate the impact of radiation on electronic circuitry, for example.

Figure 6:
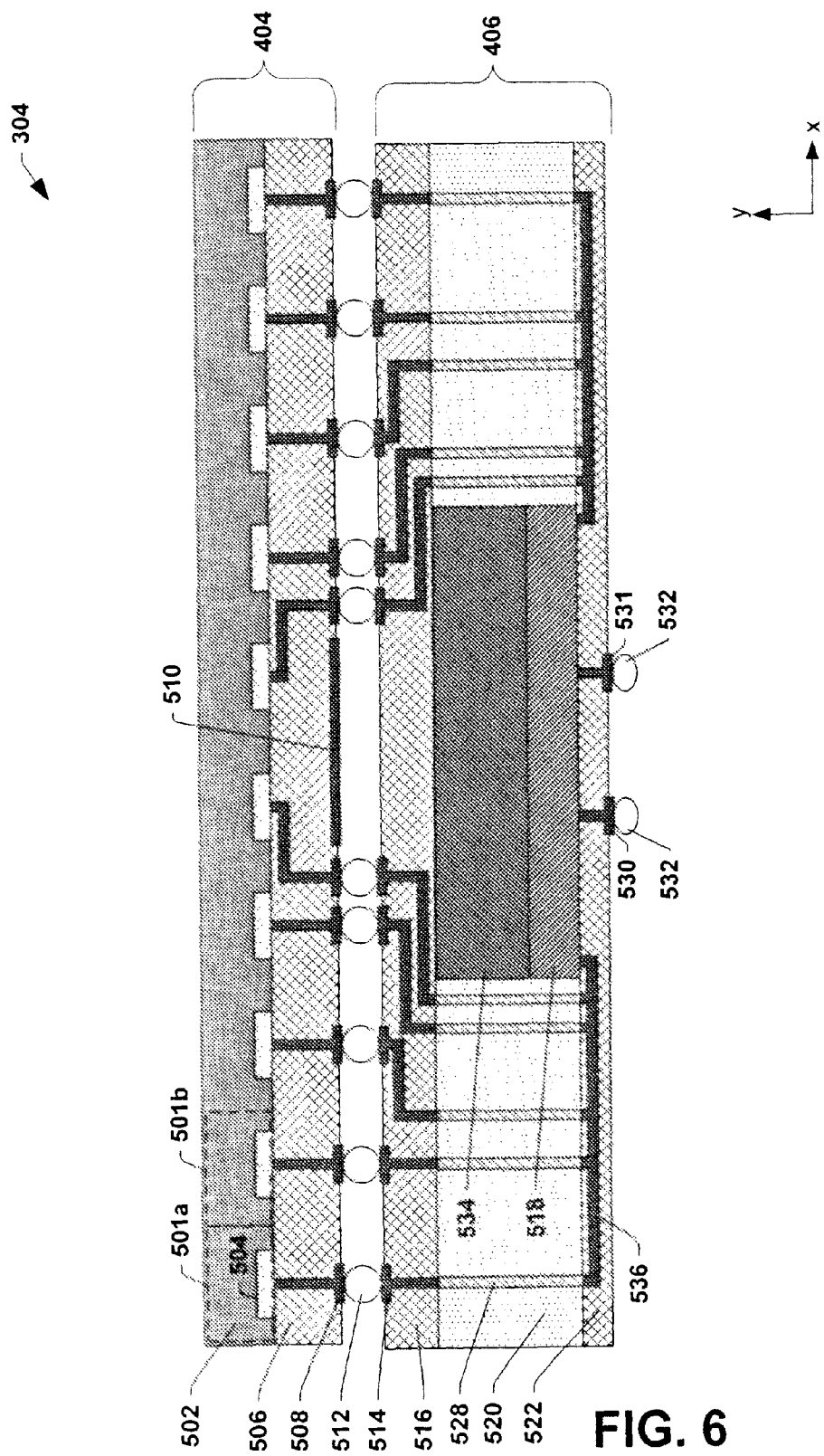
FIG. 6 illustrates a cross-sectional view of an example detector unit.

Referring to FIG. 6, a cross-sectional view of another example detector unit 304 (e.g., taken along line 4-4 in FIG. 4) comprising a radiation detection sub-assembly 404 and an electronics sub-assembly 406 is provided. In such an embodiment, the electronic circuitry 518 is situated spatially proximate to and/or adjacent the second insulator element 522, and a radiation shielding element 534 is positioned above the electronic circuitry 518 (e.g., the radiation shielding element 534 is positioned in a pathway between a radiation source 116 and the electronic circuitry 518). In some embodiments, such a configuration is configured to mitigate radiation exposure to the electronic circuitry 518, for example.

The radiation shielding element 534 is constructed of a composition having a desired (e.g., high) radiation attenuation coefficient such as tungsten or lead (e.g., where a relatively narrow slice of material attenuates nearly 100% of radiation impinging the composition) and is at least partially enclosed and/or at least partially surrounded by the molding compound 520. In some embodiments, the radiation shielding element 534 is enclosed by the molding compound 520 to facilitate the application of a first insulator element 516.

It may be appreciated that the inclusion of a radiation shielding element 534 within the electronics sub-assembly 406 and/or the placement of the electronic circuitry 518 near a bottom surface of the molding compound 520 may cause pathways for communication signals, power signals, and/or signals to ground to be configured differently than illustrated and/or described with respect to FIG. 5. For example, with respect to FIG. 6, analog signals generated by a photodetector 501 may traverse a pathway that includes an electrically conductive trace 508 of a first arrangement, a solder joint 512, an electrically conductive trace 514 of a second arrangement, a via 528 configured to carry analog signals through the molding compound 520, and an electrically conductive trace 536 of a third arrangement extending through at least a portion of the second insulator element 522. It may also be appreciated that while it appears that multiple vias are connected to the same electrically conductive trace 536, respective vias may be connected to a different trace that when clustered together appear as a single trace (e.g., the electrically conductive trace 536 may be a cluster of (e.g., separate) electrically conductive traces). Accordingly, the vias 528 illustrated in FIG. 6 carry analog communication signals instead of the digital signals and/or power signals as described with respect to FIG. 5. Further, processed signals may be output from the electronic circuitry 518 through one or more electrically conductive traces 530 of a fourth arrangement and/or power may be supplied to the electronic circuitry 518 through one or more electrically conductive traces 531 of a fifth arrangement (e.g., without being carried across one or more vias as describes with respect to FIG. 5).

Figure 7:
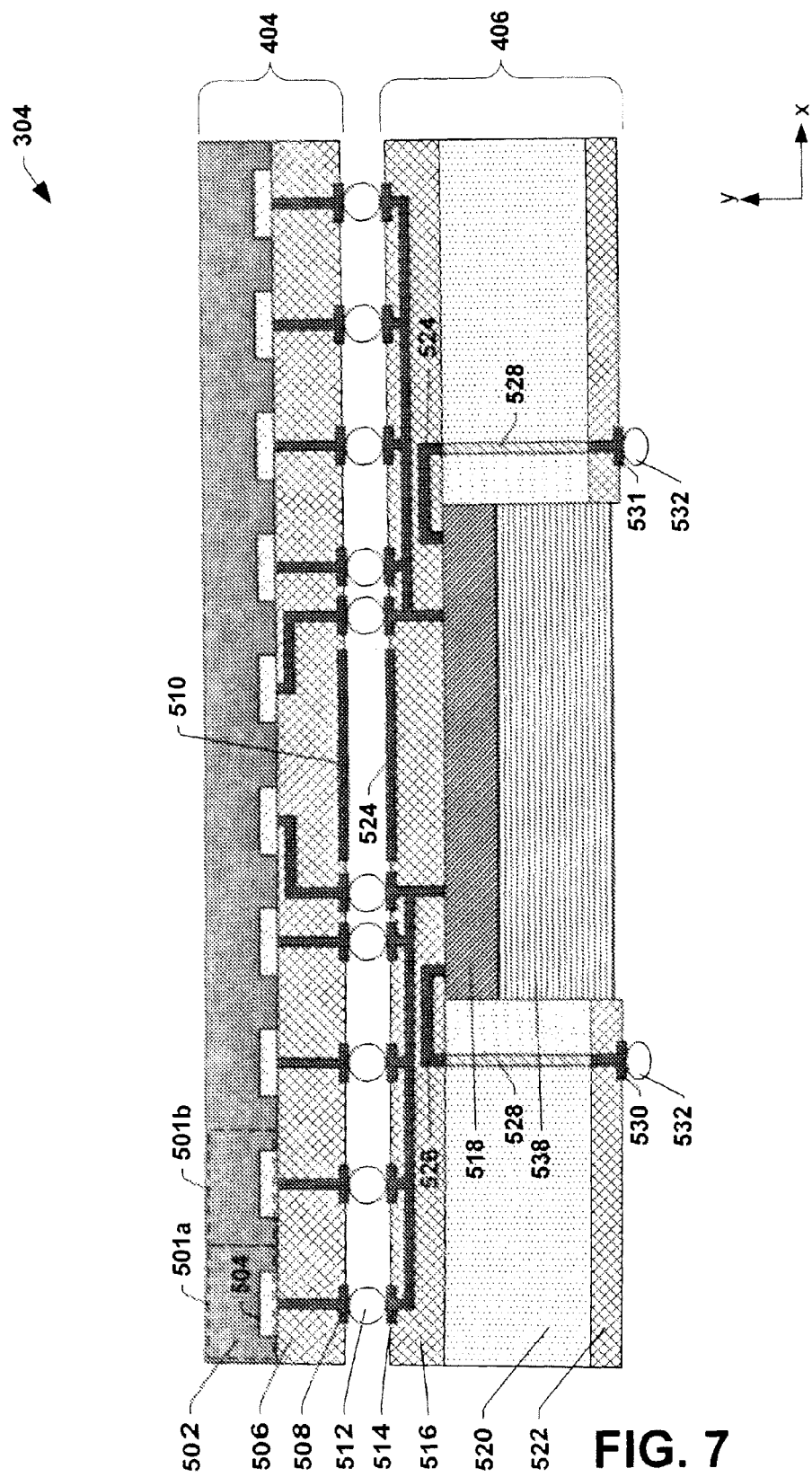
FIG. 7 illustrates a cross-sectional view of an example detector unit.

Referring to FIG. 7, a cross-sectional view of another example detector unit 304 (e.g., taken along line 4-4 in FIG. 4) comprising a radiation detection sub-assembly 404 and an electronics sub-assembly 406 is provided. In such an embodiment, a thermal conduction element 538 (e.g., a heat sink) is situated below the electronic circuitry 518 and/or adjacent the electronic circuitry 518. As will be further described with respect to FIG. 9, in some embodiments the thermal conduction element 538 extends to a bottom surface of the electronics sub-assembly 406 to facilitate thermally coupling the thermal conduction component 538 to a temperature regulation mechanism (e.g., such as a portion of the mounting bracket, a heat exchanger, etc.). Accordingly, in some embodiments, the thermal conduction element 538 may be visible on a bottom surface of the electronics sub-assembly.

The thermal conduction element 538 is thermally coupled to the electronic circuitry 518 (e.g., via a thermally conductive gel, metal contact pads, etc.) and is configured to control a temperature of the electronic circuitry 518. That is, stated differently, the thermal conduction element 538 is configured to substantially maintain the electronic circuitry 518 and/or elements thereof (e.g., A/D converters, ASICs, FGPAs, etc.) at a desired temperature or temperature range by removing heat from the electronic circuitry 518 if a temperature of the electronic circuitry 518 exceeds a desired high temperature threshold and/or by applying heat to the electronic circuitry 518 if a temperature of the electronic circuitry 518 is below a desired low temperature threshold. In this way, the thermal conduction element 538 may be configured to dissipate heat generated by elements of the electronic circuitry 518, such as an A/D converter and/or FGPA, and/or to apply heat to such elements, for example.

Figure 8:
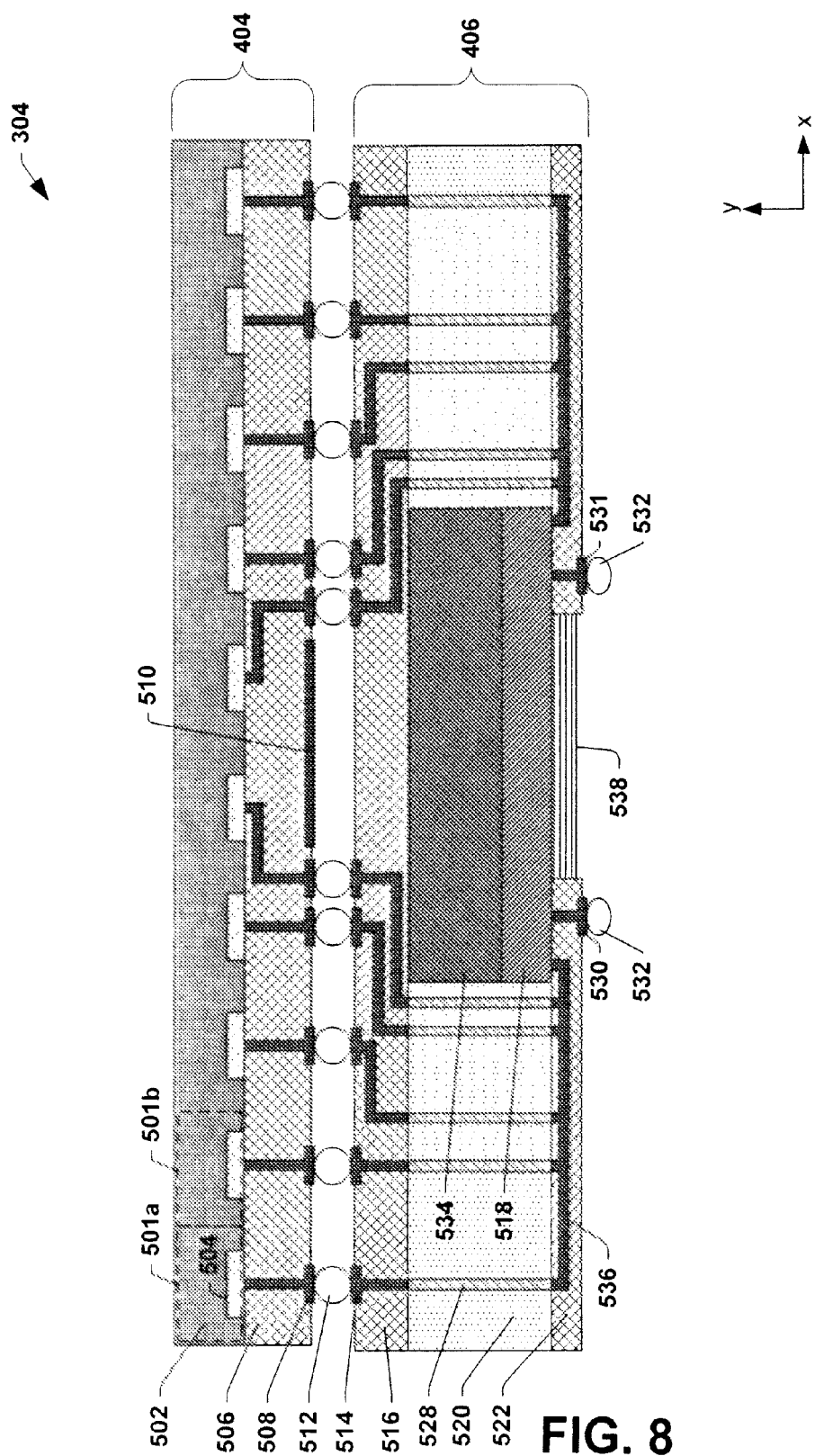
FIG. 8 illustrates a cross-sectional view of an example detector unit.

Referring to FIG. 8, a cross-sectional view of another example detector unit 304 (e.g., taken along line 4-4 in FIG. 4) comprising a radiation detection sub-assembly 404 and an electronics sub-assembly 406 is provided. The example detector unit 304 illustrated in FIG. 8 includes both a radiation shielding element 534 and a thermal conduction element 538.

The radiation shielding element 534 is situated spatially proximate a first surface of the electronic circuitry 518 (e.g., a surface of the electronic circuitry 518 facing towards a radiation source 116) while the thermal conduction element 538 is situated spatially proximate a second surface of the electronic circuitry 518, the second surface diametrically opposite the first surface. Accordingly, the electronic circuitry 518 is sandwiched between the radiation shielding element 534 and the thermal conduction element 538. The radiation shielding element 534 is configured to mitigate the exposure of radiation to the electronic circuitry 518 (e.g., where exposure of the electronic circuitry 518 to radiation may impact the performance of the electronic circuitry 518), and the thermal conduction element 538 is configured to facilitate maintaining the electronic circuitry 518 at a desired temperature and/or maintaining the electronic circuitry 518 within a desired temperature range.

Figure 9:
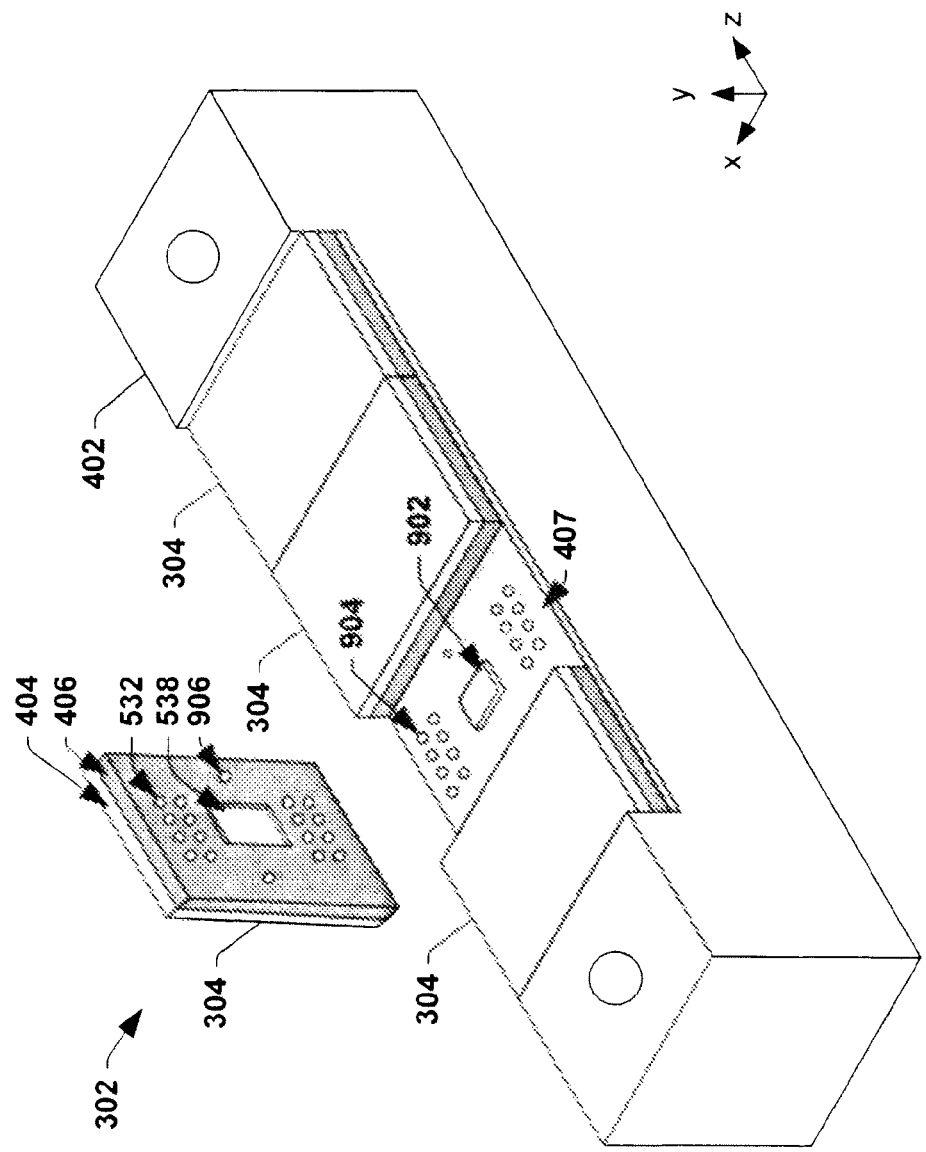
FIG. 9 illustrates a three-dimensional perspective view of an example detector module.

FIG. 9 illustrates an example detector module 302 in which a detector unit 304 is being prepared for installation on a mounting bracket 402 of the detector module 302. The detector unit 304 to be installed includes a radiation detection sub-assembly 404 and an electronics sub-assembly 406. Included within the electronics sub-assembly 406 is a thermal conduction element 538 which is depressed into the electronics sub-assembly 406 and configured to be thermally coupled to a raised portion 902 of the mounting bracket 402 (e.g., to facilitate the transfer of heat energy from the thermal conduction element 538 to the mounting bracket 402).

The electronics sub-assembly 406 further comprises contact pads 532 configured to be electrically coupled to contact pads 904 of a substrate 407 that has been mounted to the mounting bracket 402 to facilitate the transfer of power signals and/or communication signals between the detector unit 304 (e.g., or an electronics sub-assembly 406 thereof) and other components of a radiation imaging modality, such as an image generator 122, a controller 130, a threat analysis component, a power source, etc. and/or to facilitate coupling the detector unit 304 to ground, for example.

In some embodiments, the detector unit 304 comprises one or more fiducials 906 for aligning the detector unit 304 on the substrate 407, on the mounting bracket 402, and/or on a detector array 118 of which the detector module 302 is a member. By way of example, in some embodiments, the fiducials 906 may comprise optical fiducials for optically aligning the detector unit 304 with the mounting bracket 402. For example, the mounting bracket 402 may comprise one or more apertures through which is a laser beam or other light source may be guided and the optical fiducials may comprise a reflective material configured to reflect the laser or other light. When a sufficient degree of the laser beam or light source is reflected back through the aperture(s), it may be determined that the detector unit 304 is aligned with the mounting bracket 402 as desired. In other embodiments, the fiducials 906 may comprise physical fiducials for physically aligning the detector unit 304 with the mounting bracket 402 and/or the detector array 118. By way of example, the detector unit 304 may comprise a female fiducial (e.g., an aperture) configured to be mated with a corresponding male fiducial of the mounting bracket 402 (e.g., a pin which extends from a surface of the mounting bracket 402 adjacent the detector unit 304) or vice-versa.

Figure 10:
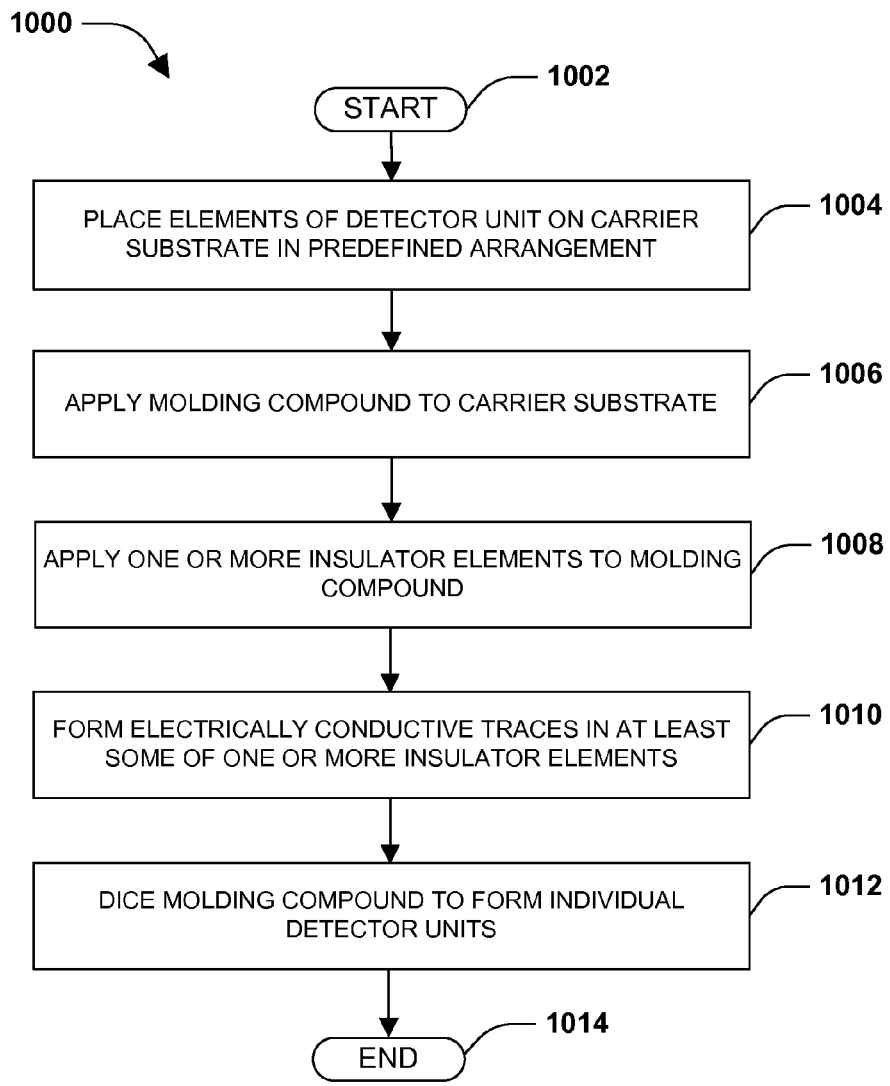
FIG. 10 is a flow diagram illustrating an example semiconductor fabrication technique which may be used to fabricate at least some of a detector unit.

FIG. 10 is a flow diagram illustrating an example semiconductor fabrication technique 1000 which may be used to fabricate at least a portion of a detector unit, such as an electronics sub-assembly, for example.

The example technique 1000 begins at 1002 and elements of the detector unit to be included within the fabricated portion of the detector unit are placed on a carrier substrate in a predefined arrangement at 1004. The elements may include, among other things, electronic circuitry (e.g., A/D converters, resistors, ASICs, FGPAs, capacitors, etc.) and/or vias. The carrier may include a wafer substrate and/or an interconnect panel, for example, which may facilitate the production of multiple detector units concurrently.

At 1006 in the example technique 1000, a molding compound is applied to the carrier substrate (e.g., poured over the carrier substrate). The molding compound is configured to affix the elements in the predefined arrangement and may at least partially enclose and/or surround a portion of the elements placed on the carrier substrate. In some embodiments, the molding compound is applied in such a manner as to not enclose electrical contact pads of the elements (e.g., to facilitate electrically coupling components together later in the technique). In some embodiments, the molding compound is poured over the carrier substrate and cooled to form a rigid or semi-rigid structure.

At 1008 in the example technique 1000, one or more insulator elements are applied to the molding compound, and at 1010 in the example technique 1000 electrically conductive traces are formed in at least some of the one or more insulator elements. In some embodiments, applying the insulator element(s) and/or forming the electrically conductive traces is performed via a lithographic process, where the electrically conducting traces are, for example, etched and/or implanted into the at least some of the one or more insulator elements.

At 1012 in the example technique 1000, the molding compound is diced to form individual detector units to which additional elements (if any) of the detector unit, such as a radiation detection sub-assembly and/or a scintillator, for example, may be applied.

It may be appreciated that in some embodiments, the detector units may be diced in a manner that causes multiple detector units to remain physically coupled to one another. By way of example, a detector module may comprise a column of four detector units. Accordingly, in some embodiments, the molding compound may be diced such that a column of four detector units remains physically joined (e.g., such that the four detector units may be treated as a single detector unit and summarily coupled to a mounting bracket). In other embodiments, the detector module may comprise merely one detector unit. The example technique 1000 ends at 1014.

In some embodiments, prior to dicing the molding compound at 1012, respective detector units comprised in the molding compound may be electrically interconnected. For example, electrically conductive traces of a first detector unit may be electrically coupled to electrically conductive traces of a second detector unit. Accordingly, in some embodiments, prior to dicing the molding compound at 1012, electrical signals may be applied to the wafer or interconnect panel to (e.g., concurrently) test the performance of respective detector units. In this way, defective detector units may be identified prior to dicing the molding compound and forming individual detector units.

Figure 11:
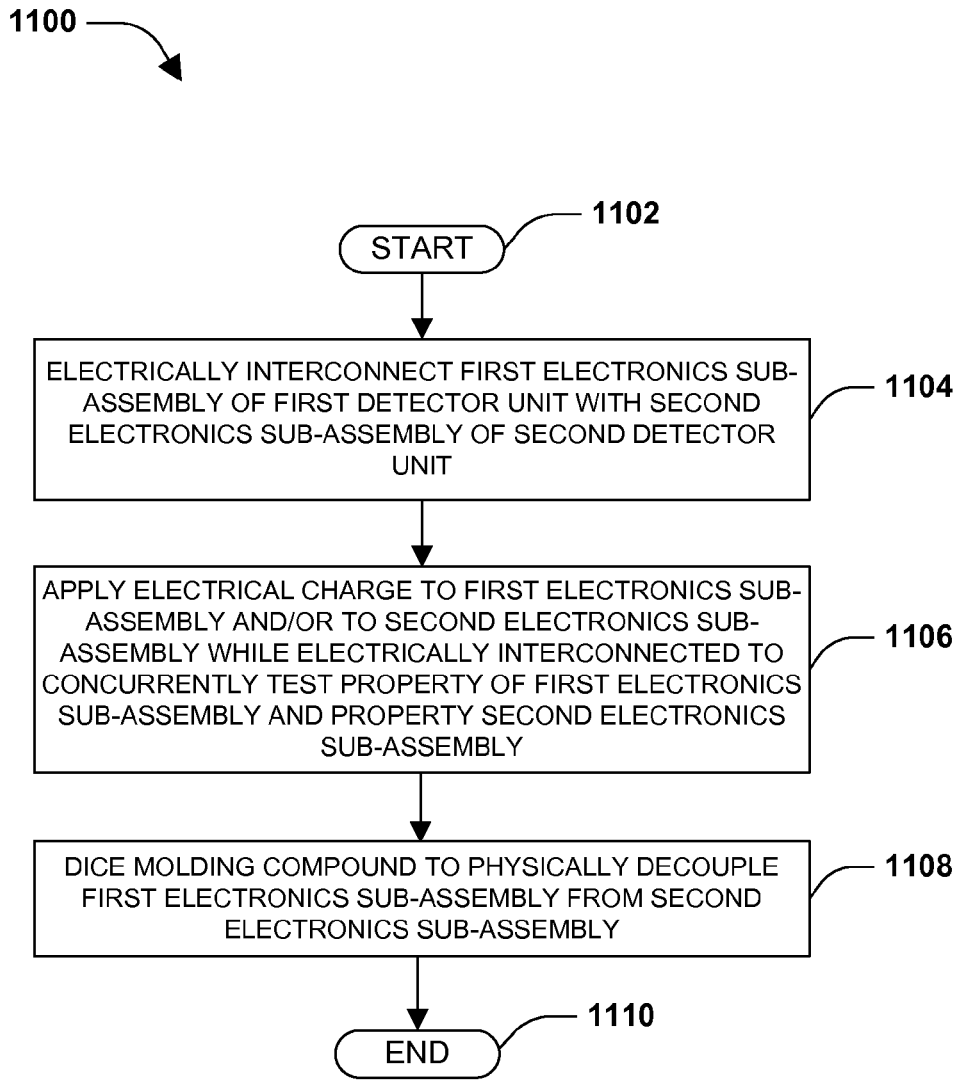
FIG. 11 is a flow diagram illustrating an example method for concurrently testing a plurality of detector units.

FIG. 11 provides a flow-diagram of an example method 1100 for testing the performance of a plurality of detector units by applying an electrical charge to a wafer, substrate or interconnect panel comprising the two or more detector units. The method 1100 starts at 1102, and a first electronics sub-assembly of a first detector unit is electrically interconnected with a second electronics sub-assembly of a second detector unit at 1104 (e.g., via a lithographic process). By way of example, electrically conductive traces formed in the first electronics sub-assembly may be electrically connected to electrically conductive traces formed in the second electronics sub-assembly to electrically interconnect the first electronics sub-assembly with the second electronics sub-assembly. In an example, the first electronics sub-assembly and the second electronics sub-assembly are formed within a (e.g., continuous) molding compound.

At 1106, a charge is applied to the first electronics sub-assembly and/or to the second electronics sub-assembly to concurrently test a property of the first electronics sub-assembly and a property of the second electronics sub-assembly. By way of example, the first electronics sub-assembly may be electrically coupled to a power source configured to apply a charge to the first electronics sub-assembly. Because of the electrical interconnection between the first electronics sub-assembly and the second electronics sub-assembly, such electrical charge may be carried to the second electronics sub-assembly to facilitate testing the first electronics sub-assembly and the second electronics sub-assembly via the application of an electrical charge to the first electronics sub-assembly. A response of the first electronics sub-assembly to the electrical charge and a response of the second electronics sub-assembly to the electrical charge may be measured to measure a performance of the first electronics sub-assembly (e.g., thus testing one or more properties of the first electronics sub-assembly) and/or to measure a performance of the second electronics sub-assembly (e.g., thus testing one or more properties of the second electronics sub-assembly). In this manner, one or more electronics sub-assemblies may concurrently be tested by the application of a test signal(s) to merely one or a few locations on a wafer, substrate, etc. comprising the one or more electronics sub-assemblies.

At 1108 in the example method 1100, the molding compound into which the first electronics sub-assembly and the second electronics sub-assembly are embedded is diced to physically and/or electrically decouple the first electronics sub-assembly from the second electronics sub-assembly. The example method 1100 ends at 1110.

Figure 12:
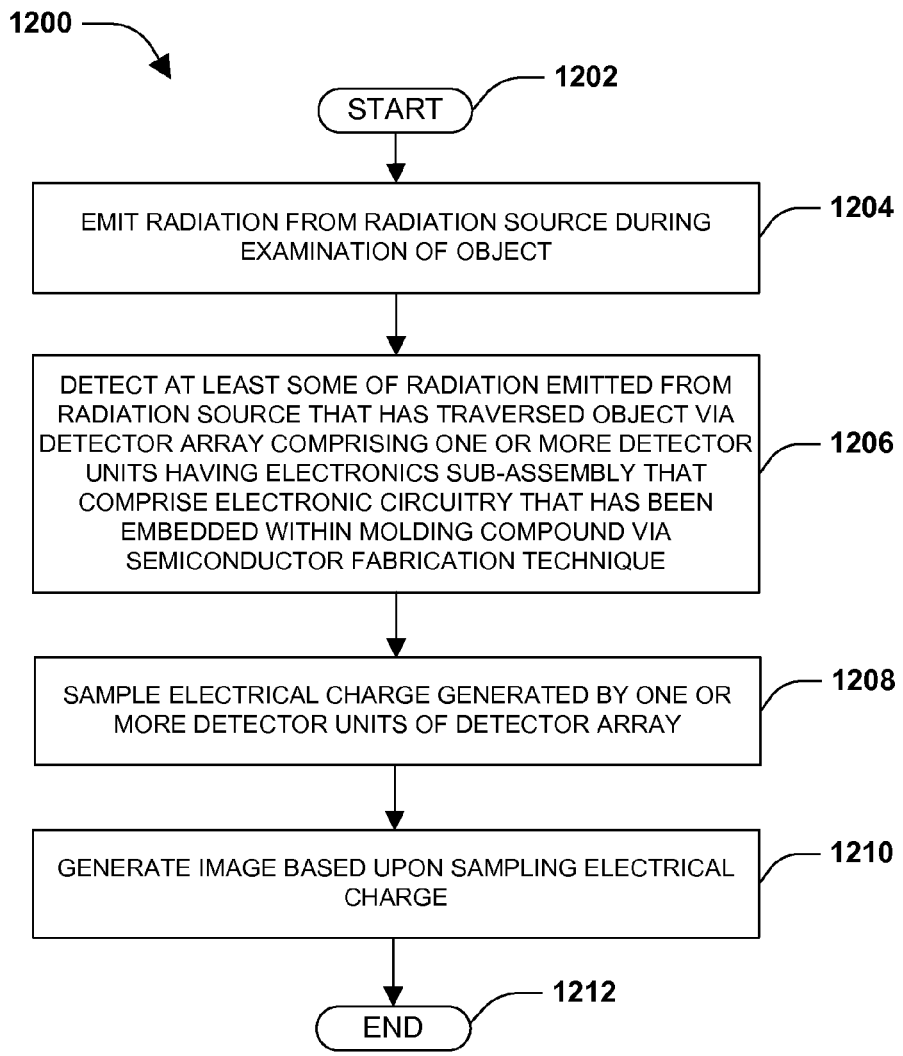
FIG. 12 is a flow diagram illustrating an example method for examining an object.

The detector unit formed according to the technique 1000 described with respect to FIG. 10 may be used when examining an object, such as a person, baggage, animal, etc., via ionizing radiation, such as x-rays or gamma rays. FIG. 12 provides a flow diagram of an example method 1200 for performing an examination on an object using a detector unit having at least some of the foregoing features.

The example method 1200 begins at 1202, and radiation is emitted from a radiation source into an examination region comprising the object to be examined at 1204. At 1206 in the example method 1200, at least some of the radiation emitted from the radiation source that has traversed the object is detected by a detector array comprising one or more detector units having an electronics sub-assembly that includes electronic circuitry that has been embedded within a molding compound via a semiconductor fabrication technique. Such electronic circuitry may include, among other things, A/D converters, resistors, ASICs, FGPAs, capacitors, which have been embedded within a molding compound, such as a silicon or polymer, for example. In some embodiments, such as electronics sub-assembly may further comprise a radiation shielding element and/or a thermal conduction element, for example.

At 1208 in the example method 1200, electrical charge generated by the one or more detector units of the detector array is sampled, to determine an amount of radiation detected by one or more detector units of the detector array, to determine an amount of radiation detected by the detector array, to determine differences in the amounts of radiation detected by respective detector units of the detector array, etc.

At 1210 in the example method 1200, an image of the object is generated based upon sampling the electrical charge. The example method 1200 ends at 1212.

Figure 13:
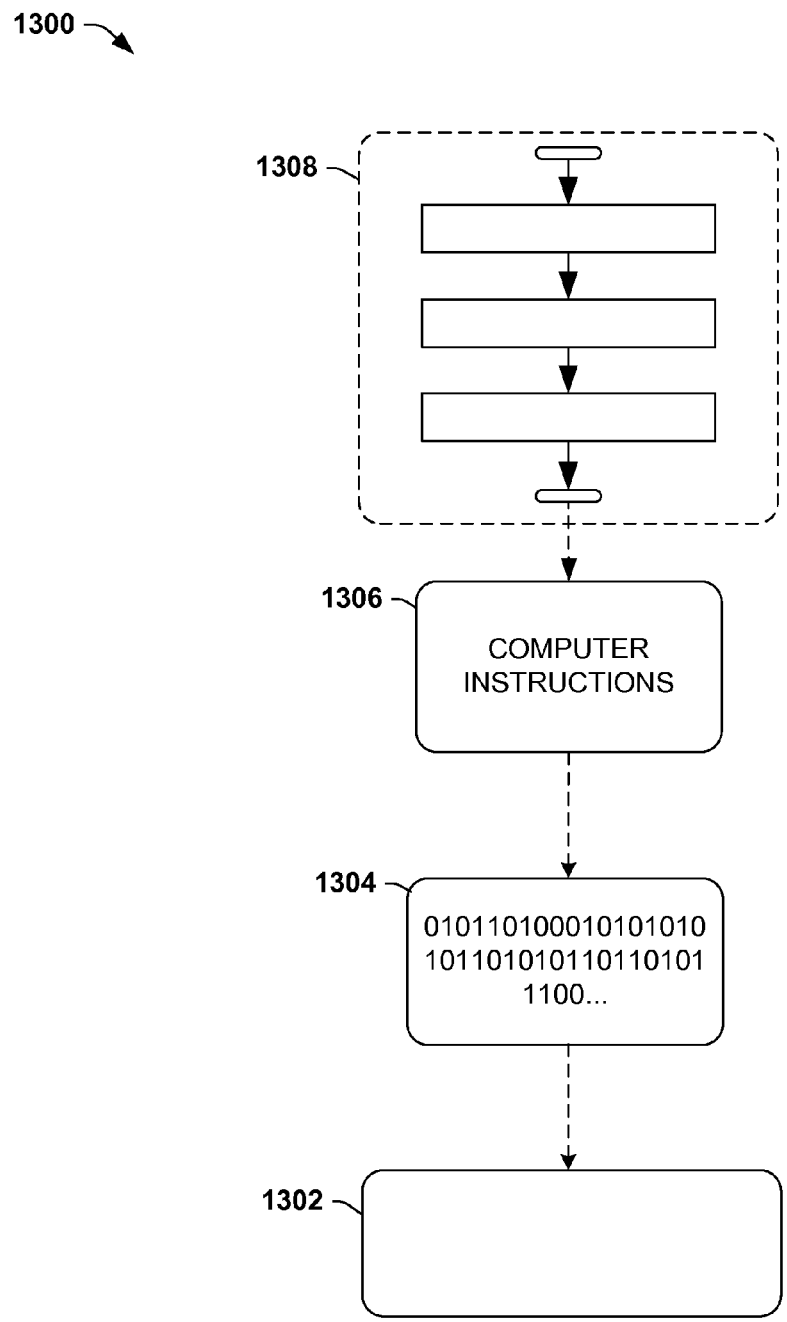
FIG. 13 is an illustration of an example computer-readable medium comprising processor-executable instructions configured to embody one or more of the provisions set forth herein.

Still another embodiment involves a computer-readable medium comprising processor-executable instructions configured to implement one or more of the techniques presented herein. An example computer-readable medium that may be devised in these ways is illustrated in FIG. 13, wherein the implementation 1300 comprises a computer-readable medium 1302 (e.g., a flash drive, CD-R, DVD-R, application-specific integrated circuit (ASIC), field-programmable gate array (FPGA), a platter of a hard disk drive, etc.), on which is encoded computer-readable data 1304. This computer-readable data 1304 in turn comprises a set of processor-executable instructions 1306 configured to operate according to one or more of the principles set forth herein. In one such embodiment 1300, the processor-executable instructions 1306 may be configured to perform a method 1308 when executed via a processing unit, such as at least some of the example method 1000 of FIG. 10, at least some of the example method 1100 of FIG. 11, and/or at least some of the example method 1200 of FIG. 12. In another such embodiment, the processor-executable instructions 906 may be configured to implement a system, such as at least some of the example environment 100 of FIG. 1. Many such computer-readable media may be devised by those of ordinary skill in the art that are configured to operate in accordance with one or more of the techniques presented herein. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth, or deposition techniques such as chemical vapor deposition (CVD), physical vapor deposition (PVD), plasma enhanced chemical vapor deposition (PECVD), or atomic layer deposition (ALD), for example.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". The claimed subject matter may be implemented as a method, apparatus, or article of manufacture (e.g., as software, firmware, hardware, or any combination thereof).

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally correspond to "channel A and channel B" or two different (or identical) channels or the same channel).

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and/or advantageous for any given or particular application.

What is claimed is:

1. A detector unit for a detector array of a radiation imaging modality, comprising:
    a radiation detection sub-assembly configured to detect radiation; and
    an electronics sub-assembly, comprising:
        an analog-to-digital (A/D) converter configured to convert an analog signal generated by the radiation detection sub-assembly into a digital signal; and
        a molding compound configured to surround at least a portion of the A/D converter, wherein:
            a via is disposed in the molding compound through which the analog signal generated by the radiation detection sub-assembly is transmitted to a backside of the A/D converter facing away from the radiation detection sub-assembly, and
            the electronics sub-assembly comprises a plurality of contact pads for electrical contact with a plurality of contacts pads disposed on a substrate to which the detector unit is attached.

2. The detector unit of claim 1, comprising:
    a thermal conduction element positioned under the A/D converter; and
    an insulator element disposed below the molding compound, wherein a recess is defined in the detector unit by a surface of the thermal conduction element, a first sidewall of the insulator element, and a second sidewall of the insulator element.

3. The detector unit of claim 2, the via comprising at least one of copper, nickel, or silicon.

4. The detector unit of claim 1, comprising an insulator element configured to at least one of:
    electrically isolate the A/D converter from the radiation detection sub-assembly, or electrically isolate a first electrically conductive trace from a second electrically conductive trace.

5. The detector unit of claim 1, comprising a radiation shielding element positioned between the radiation detection sub-assembly and the A/D converter.

6. The detector unit of claim 1, the molding compound comprising a polymer.

7. The detector unit of claim 1, comprising a fiducial for aligning the detector unit on the detector array.

8. The detector unit of claim 7, the fiducial comprising an optical fiducial for optically aligning the detector unit on the detector array.

9. The detector unit of claim 7, the fiducial comprising a physical fiducial for physically aligning the detector unit on the detector array.

10. The detector unit of claim 1, comprising a thermal conduction element configured to dissipate heat generated by the A/D converter.

11. A detector unit for a detector array of a radiation imaging modality, comprising:
    a radiation detection sub-assembly configured to detect radiation; and
    an electronics sub-assembly, comprising:
        an analog-to-digital (A/D) converter configured to convert an analog signal generated by the radiation detection sub-assembly into a digital signal;
        an insulator element situated between the radiation detection sub-assembly and the A/D converter; and
        a molding compound in which the A/D converter is embedded, wherein:
            a via is disposed in the molding compound through which the analog signal generated by the radiation detection sub-assembly is transmitted to a backside of the A/D converter facing away from the radiation detection sub-assembly, and
            the electronics sub-assembly comprises a plurality of contact pads for electrical contact with a plurality of contacts pads disposed on a substrate to which the detector unit is attached.

12. The detector unit of claim 11, the radiation detection sub-assembly comprising:
    a scintillator configured to convert radiation energy into light energy; and
    a photodetector configured to convert the light energy into the analog signal.

13. The detector unit of claim 11, the electronics sub-assembly comprising:
    an electrically conductive trace coupled to ground and configured to provide for electrical shielding.

14. The detector unit of claim 11, the electronics sub-assembly comprising:
    a radiation shielding element situated between the A/D converter and the radiation detection sub-assembly and configured to mitigate exposure of the A/D converter to radiation.

15. The detector unit of claim 11, the electronics sub-assembly comprising:
    a thermal conduction element positioned substantially diametrically opposite the A/D converter relative to the radiation detection sub-assembly and configured to dissipate heat generated by the A/D converter.

16. The detector unit of claim 11, comprising:
    an insulator element, and
    an electrically conductive trace disposed in the insulator element extending from the via to the backside of the A/D converter.

17. The detector unit of claim 11, comprising an electrically conductive trace configured to electrically couple the A/D converter to the radiation detection sub-assembly.

18. A radiation imaging modality, comprising:
    an ionizing radiation source; and
    a detector array configured to detect radiation generated by the ionizing radiation source, the detector array comprising a substrate having a raised portion and a detector unit fabricated at least in part using a semiconductor fabrication technique, the detector unit comprising:
        an analog-to-digital (A/D) converter configured to convert an analog signal generated in response to detected radiation into a digital signal;
        a molding compound configured to surround at least a portion of the A/D converter;
        a thermal conduction element positioned under the A/D converter;
        an insulator element disposed below the molding compound; and
        an electrically conductive trace configured to electrically couple the A/D converter to at least one of a radiation detection sub-assembly or a digital processing component, wherein:
            the detector unit defines a recess for receiving the raised portion upon the detector unit being mounted to the substrate, and
            the recess is defined by a surface of the thermal conduction element, a first sidewall of the insulator element, and a second sidewall of the insulator element.

19. The radiation imaging modality of claim 18, wherein the insulator element is in contact with the molding compound.

20. The radiation imaging modality of claim 18, wherein a via is disposed in the molding compound through which the analog signal generated in response to detected radiation is transmitted to a backside of the A/D converter facing away from the ionizing radiation source.

* * * * *